(12) United States Patent
Ecton et al.

(10) Patent No.: US 12,394,719 B2
(45) Date of Patent: Aug. 19, 2025

(54) METHODS AND APPARATUS TO INCREASE GLASS CORE THICKNESS

(71) Applicant: Intel Corporation, Santa Clara, CA (US)

(72) Inventors: Jeremy Ecton, Gilbert, AZ (US); Brandon Marin, Gilbert, AZ (US); Srinivas Pietambaram, Chandler, AZ (US); Bai Nie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 17/482,084

(22) Filed: Sep. 22, 2021

(65) Prior Publication Data

US 2023/0093522 A1    Mar. 23, 2023

(51) Int. Cl.
*H01L 23/538* (2006.01)
*H01L 21/48* (2006.01)

(52) U.S. Cl.
CPC ...... *H01L 23/5383* (2013.01); *H01L 21/4857* (2013.01); *H01L 21/486* (2013.01)

(58) Field of Classification Search
CPC ............ H01L 23/5383; H01L 21/4857; H01L 21/486; H01L 23/538; H01L 21/48
USPC ......................................................... 174/257
See application file for complete search history.

(56) References Cited

U.S. PATENT DOCUMENTS

2021/0120680 A1* 4/2021 Pun ........................ H05K 1/141

* cited by examiner

*Primary Examiner* — Tremesha W Burns
(74) *Attorney, Agent, or Firm* — Hanley, Flight & Zimmerman, LLC

(57) ABSTRACT

Methods and apparatus to increase glass core thickness are disclosed. An example apparatus includes a first glass substrate, a second glass substrate, an interface layer between the first glass substrate and the second glass substrate, the interface layer coupling the first glass substrate to the second glass substrate, and an interconnect extending through at least a portion of the first glass substrate and at least a portion of the second glass substrate.

23 Claims, 12 Drawing Sheets

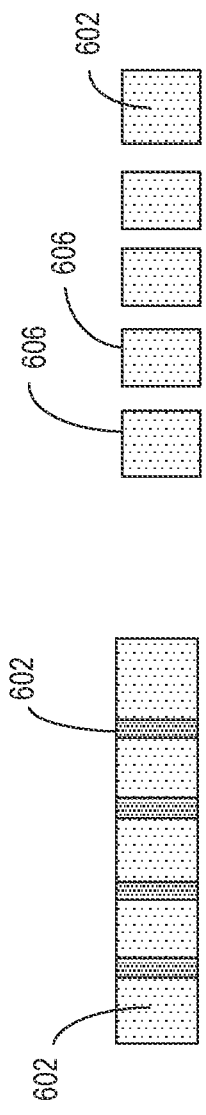
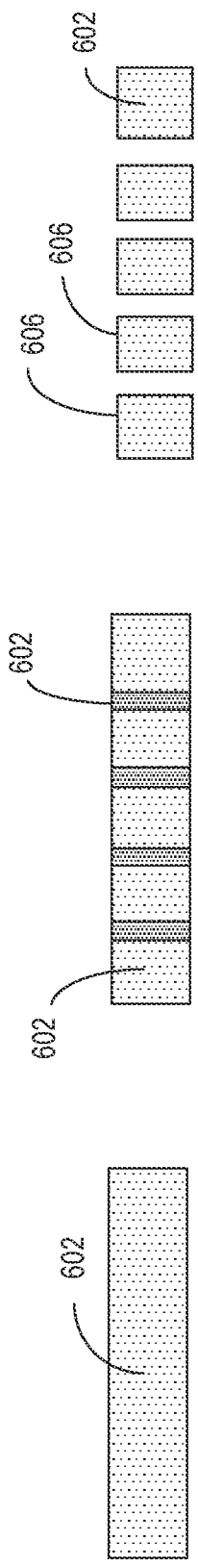
FIG. 6A
FIG. 6B
FIG. 6C
FIG. 6D
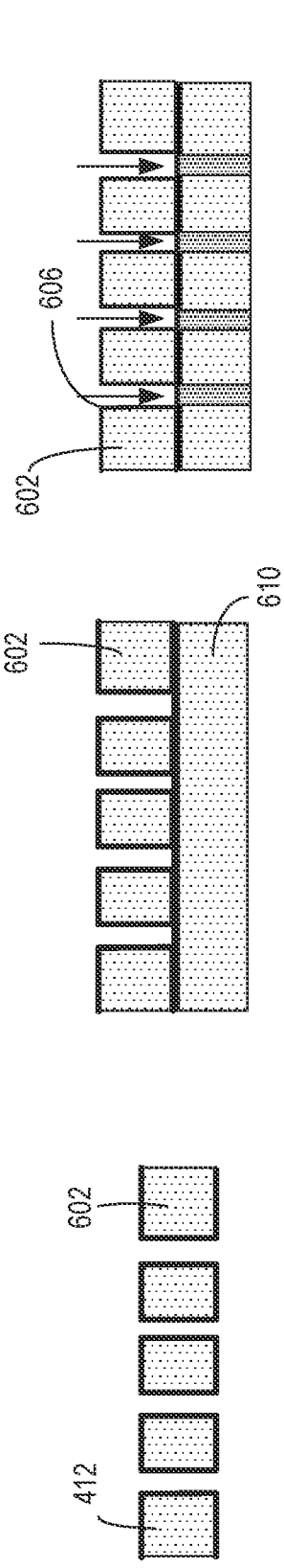
FIG. 6E
FIG. 6F
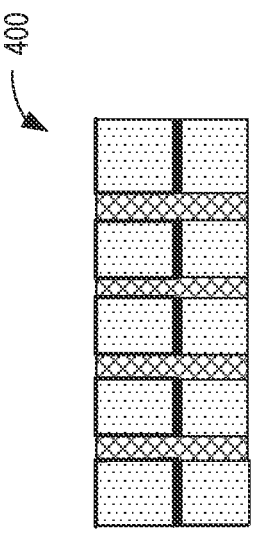
FIG. 6G
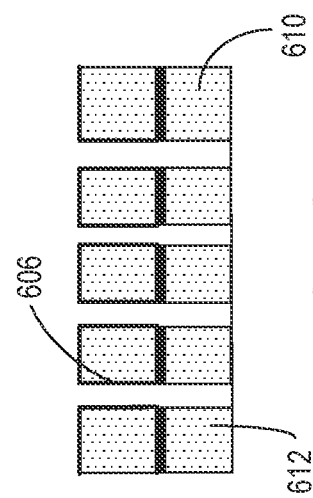
FIG. 6H

METHODS AND APPARATUS TO INCREASE GLASS CORE THICKNESS

FIELD OF THE DISCLOSURE

This disclosure relates generally to glass cores in semiconductor devices and, more particularly, to methods and apparatus to increase glass core thickness.

BACKGROUND

Glass cores can be implemented to enable relatively fine die-to-die connections in semiconductor devices. Generally, glass core implementations offer several advantages compared to implementations with conventional epoxy cores, including a higher plated through-hole (PTH) density, lower signal losses, and a lower total thickness variation.

BRIEF DESCRIPTION OF THE DRAWINGS

FIGS. 6A-6H illustrate example stages in an example fabrication process to produce the example semiconductor device of FIG. 4.

Figure 1:
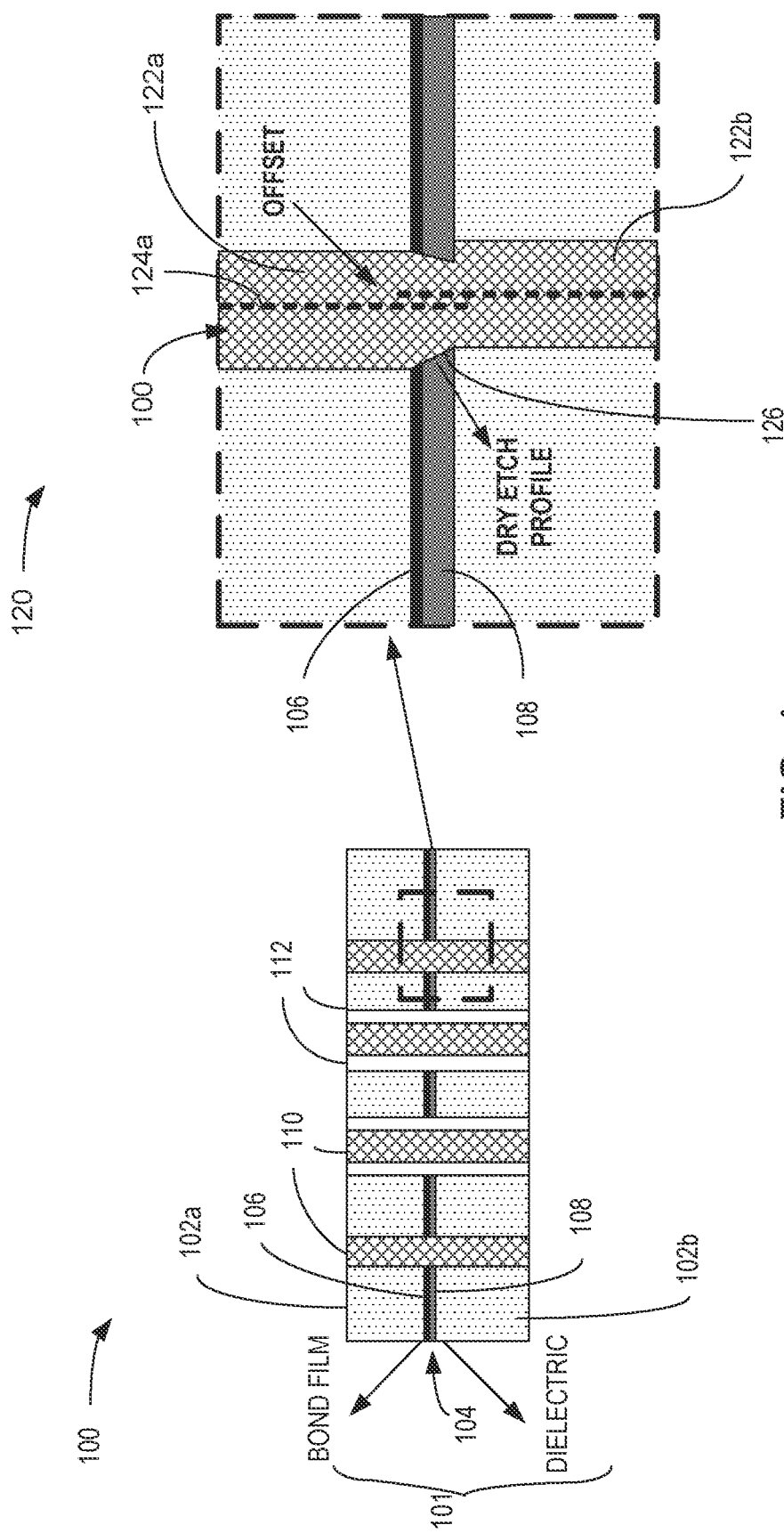
FIG. 1 is a cross-sectional view of an example semiconductor device in accordance with teachings of this disclosure.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part.

As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

Methods and apparatus to increase glass core thickness are disclosed. Glass cores can be implemented for relatively fine die-to-die connections for semiconductor devices. In particular, interconnects, such as vias, can be densely placed in a given area of a semiconductor device. A thicker glass core can enable improved power delivery and handling capabilities. However, for known implementations, glass cores with a relatively higher degree of thickness can have significant failure risks due to potential cracks, etc.

Examples disclosed herein enable semiconductor devices with glass cores that have a relatively high degree of thickness compared to known implementations. Further, examples disclosed herein can have increased strength, thereby reducing or eliminating requirements for special handling typically necessitated for known glass core implementations. Further, examples disclosed can also be highly resistant to cracking and/or damage, and can provide improved power performance, as well as increased plated through-hole (PTH) density.

Examples disclosed herein utilize multiple glass layers and/or cores to define a damage-resistant glass core that is significantly thicker than known glass core implementations. In other words, examples disclosed herein enable stacking of multiple glass portions, cores and/or layers. For example, examples disclosed herein can enable thicknesses of greater than 500 micrometers (μm) (e.g., greater than 2,000 μm). Examples disclosed herein utilize an interface layer to couple first and second glass portions (e.g., first and second glass layers, first and second glass substrates, etc.) together. The interface layer can include at least one of a dielectric (e.g., a dielectric layer) or a bonding film/layer. An interconnect, such as a through-glass via (TGV) extends through first and second glass portions. In some examples, the interconnect includes a first portion that extends through at least a portion of the first glass layer and a second portion that extends through at least a portion of the second glass layer. In some examples, the first and second portions of the interconnect are substantially aligned (e.g., aligned within a distance that is approximately 20% of their nominal outer diameters or 20% of a smaller diameter between the first and second portions).

As used herein, stating that two components, assemblies and/or features are "substantially aligned" means that the two components, assemblies and/or feature are within a distance that is smaller or equal to 20% of an exterior dimension (e.g., a diameter) of a smaller component of the two components. As used herein, the term "glass core" refers to multiple glass layers, portions and/or substrates that are coupled together.

FIG. 1 is a cross-sectional view of an example semiconductor device 100 in accordance with teachings of this disclosure. The semiconductor device 100 of the illustrated example includes a glass core 101 with a first glass portion (e.g., a glass substrate, a glass layer, a glass substrate layer, etc.) 102a and a second glass portion 102b, such that the first glass portion 102a is separated from the second glass portion 102b by an interface layer 104. The example interface layer 104 is positioned between the first and second glass portions 102a, 102b, and can include at least one of a bond film 106 and a dielectric (e.g., a dielectric layer) 108. Further, interconnects 110, which are implemented as TGVs in this example, extend between and/or through at least respective portions of the first glass portion 102a and the second glass portion 102b. In the illustrated example, some of the interconnects 110 are adjacent and/or surrounded by a respective plug 112, which are comprised of materials with a relatively high magnetic permeability (e.g., the materials become magnetically charged under an electric bias) and/or polarizability to define a coaxial connector, such as a metal-inductor loop (MIL) connector, for example.

In the illustrated view of FIG. 1, a detail 120 shows a portion of the example semiconductor device 100. As can be seen in the detail 120, the interconnect 110 includes a first portion 122a with a corresponding first center axis 124a. The first portion 122a extends through the first glass portion 102a. Similarly, a second portion 122b with a corresponding second center axis 124b extends through the second glass portion 102b. In this example, the first center axis 124a and the second center axis 124b are offset based on a process by which the example semiconductor device 100 is produced, as will be discussed in greater detail below in connection with FIGS. 2 and 3.

To enable the glass core 101 to have an increased thickness compared to known implementations, the first glass portion 102a is coupled to the second glass portion 102b with the interface layer 104. In particular, the example interface layer 104 includes at least one of the bond film 106 or the dielectric 108 to couple and/or hold the first glass portion 102a and the second glass portion 102b together. As a result, the glass core 101 can include multiple stacked glass portions to define a thickness that is significantly increased from known implementations. In other words, multiple glass portions can be stacked almost indefinitely, thereby removing thickness/height limitations seen in known glass core implementations. Further, by coupling and/or stacking the first glass portion 102a to the second glass portion 102b, an increased strength of the example glass core 101 can result in higher production yields while allowing increased power delivery and higher PTH density. In this example, the properties of the first glass portion 102a and the second glass portion 102b are generally identical. However, in other examples, the first glass portion 102a and the second glass portion 102b may have different properties (e.g., translucency, density, opacity, etc.).

As can be seen in the illustrated example of FIG. 1, a dry etch profile 126 is shown. The dry etch profile 126 defines a position of the center axis 124a. In other words, the first portion 122a of the interconnect 110 can be offset relative to the second portion 122b of the interconnect 110 based on the etching of the interface layer 104.

In some examples, at least one of the dielectric 108 and/or the bond film 106 is compressed between the first glass portion 102a and the second glass portion 102b to strengthen the adhesion therebetween. In some other examples, none of the plugs 112 are implemented. In some examples, the first glass portion 102a and the second glass portion 102b have similar or identical thicknesses. In other examples, the first glass portion 102a and the second glass portion 102b have different thicknesses.

Figure 2:
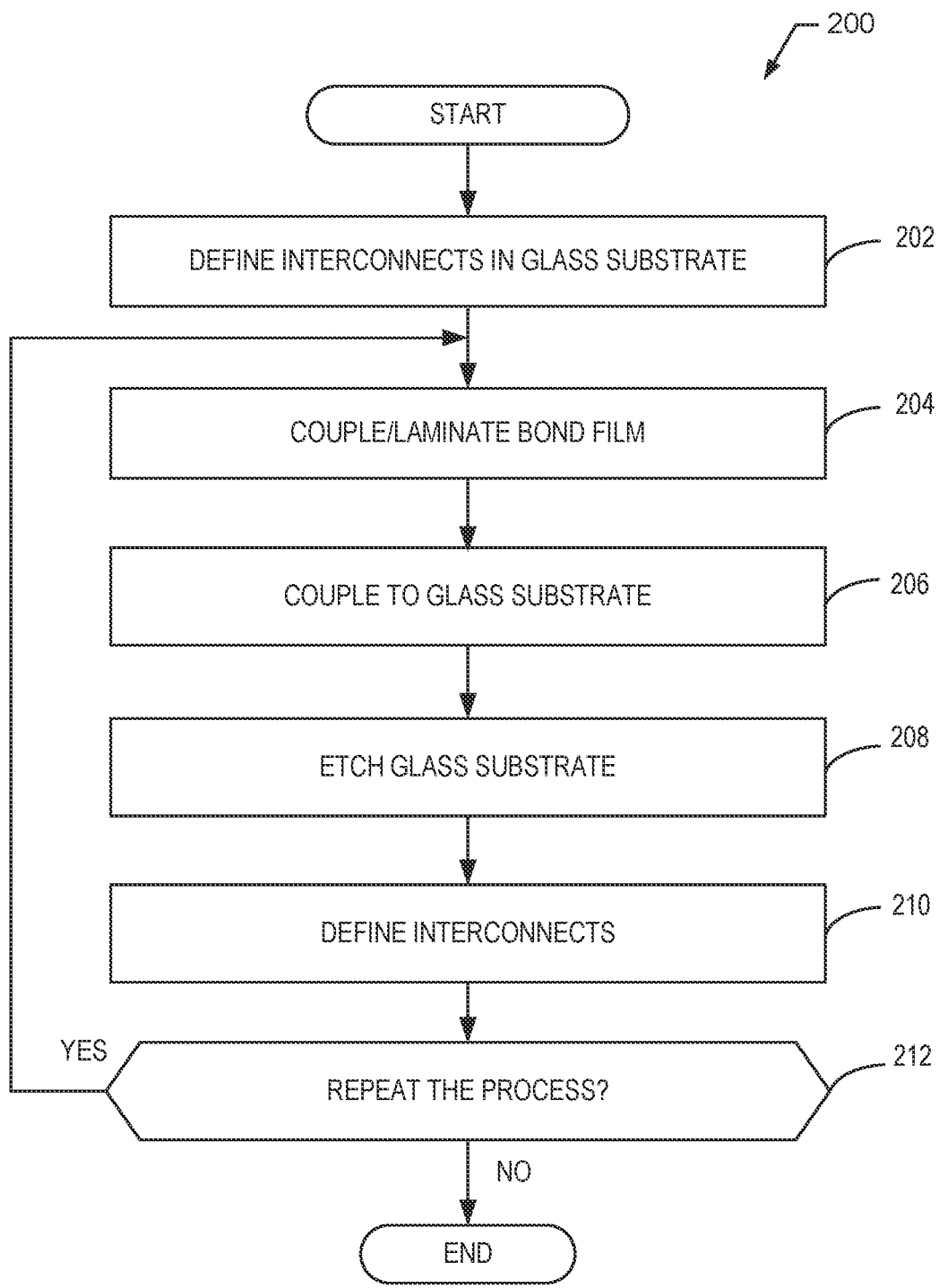
FIG. 2 is a flowchart representative of an example method to produce the example semiconductor device of FIG. 1.

FIG. 2 is a flowchart representative of an example method 200 to produce the example semiconductor device 100 of FIG. 1.

At block 202, interconnects, interconnect portions and/or vias are defined. In this particular example, the plugs 112 are provided, drilled and, subsequently, apertures of a glass substrate 301 (of FIG. 3), as well as apertures of the plugs 112, are metallized to define TGVs, thereby defining the second glass portion 102b.

At block 204, in some examples, the bond film 106 is laminated, deposited and/or coupled onto the glass substrate 301. Additionally or alternatively, the dielectric 108 is laminated, deposited and/or coupled to the glass substrate 301.

At block 206, in the illustrated example of FIG. 2, a glass substrate 303 of FIG. 3 (that will later define the first glass portion 102a) is attached and/or coupled to the glass substrate 301. In this example, the glass substrate 303 is patterned (e.g., pre-patterns) and/or etched prior to being coupled to the glass substrate 301. In some examples, the interface layer 104 is compressed between the glass substrate 301 and the glass substrate 303.

At block 208, in this example, at least a portion of the interface layer 104 is etched based on patterns of the substrate 303 (e.g., an entire thickness of the interface layer 104 is etched at openings of the patterns).

At block 210, interconnects, interconnect portions and/or vias are defined in the glass substrate 303, thereby defining the first glass portion 102a. In this example, the plugs 112 are provided (e.g., placed) and drilling thereof is performed prior to metallization.

At block 212, it is determined whether to repeat the process. If the process is to be repeated (block 212), control of the process returns to block 204. Otherwise, the process ends. The determination may be based on whether additional glass portions, cores and/or layers are to be added to the semiconductor structure 100. The additional glass portions, cores and/or layers can be patterned or un-patterned.

Figure 3A:
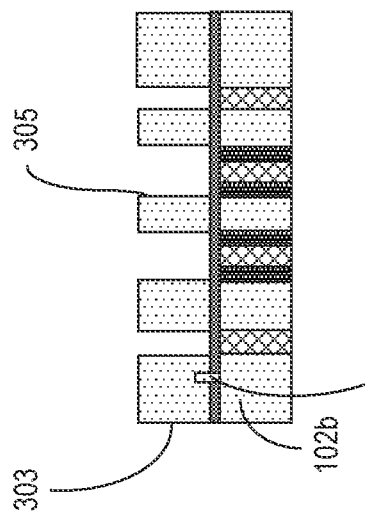
FIGS. 3A-3E illustrate example stages in an example fabrication process to produce the example semiconductor device of FIG. 1.

FIGS. 3A-3E illustrate example stages in an example fabrication process to produce the example semiconductor device 100 of FIG. 1. Turning to FIG. 3A, the aforementioned glass substrate 301 is shown with the interconnects 110 and the plugs 112 defined therein. In this example, the interconnects 110 and the plugs 112 are defined by placing the plugs 112 that are insulative/non-conductive in this example, drilling the plugs 112, and metallizing portions of glass substrate 301 to define the second glass portion 102b.

Figure 3B:
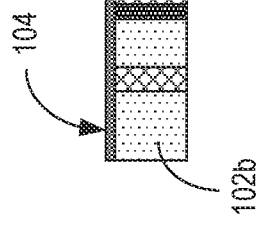

FIG. 3B depicts the interface layer 104 placed onto the second glass portion 102b. In this example, the interface layer 104 is laminated onto the second glass portion 102b.

Figure 3C:
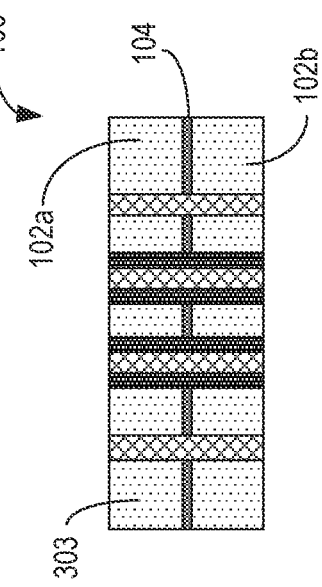

Turning to the FIG. 3C, the glass substrate 303 is shown coupled to the second glass portion 102b. In this example, the glass substrate 303 is patterned (e.g., pre-patterned) prior to being coupled to the second glass portion 102b. Patterns of the example glass substrate 303 correspond to apertures 305 shown in FIG. 3C. In some examples, the placement of the glass substrate 303 is based on aligning the apertures 305 to features and/or datums of the second glass portion 102b. In some examples, grooves and/or protruding features 304 may be incorporated into the glass substrate 301 and/or the glass substrate 303 to substantially align the patterns of the glass substrate 303 and/or the glass substrate relative to the glass substrate 301 (e.g., align the glass substrate 303 to a substantially aligned position therebetween).

Figure 3D:
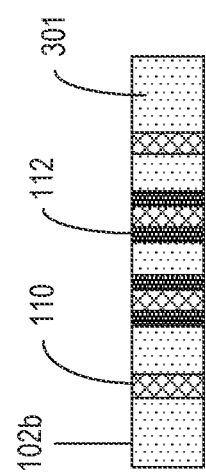

FIG. 3D depicts the example interface layer 104 being etched to expose surfaces 306 above the second glass portion 102b (in the view of FIG. 3D).

Figure 3E:
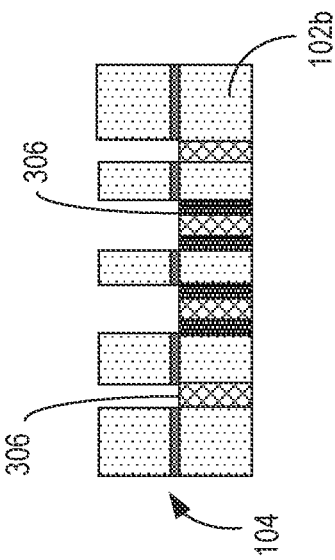

FIG. 3E depicts the glass substrate 303 being provided with the plug 112 that has a relatively high magnetic permeability and/or polarizability. In turn, the substrate 303 is drilled and metallized to define the first glass portion 102a that is coupled to the second glass portion 102b via the interface layer 104. As a result, the semiconductor device 100 shown in FIG. 1 is produced.

Figure 4:
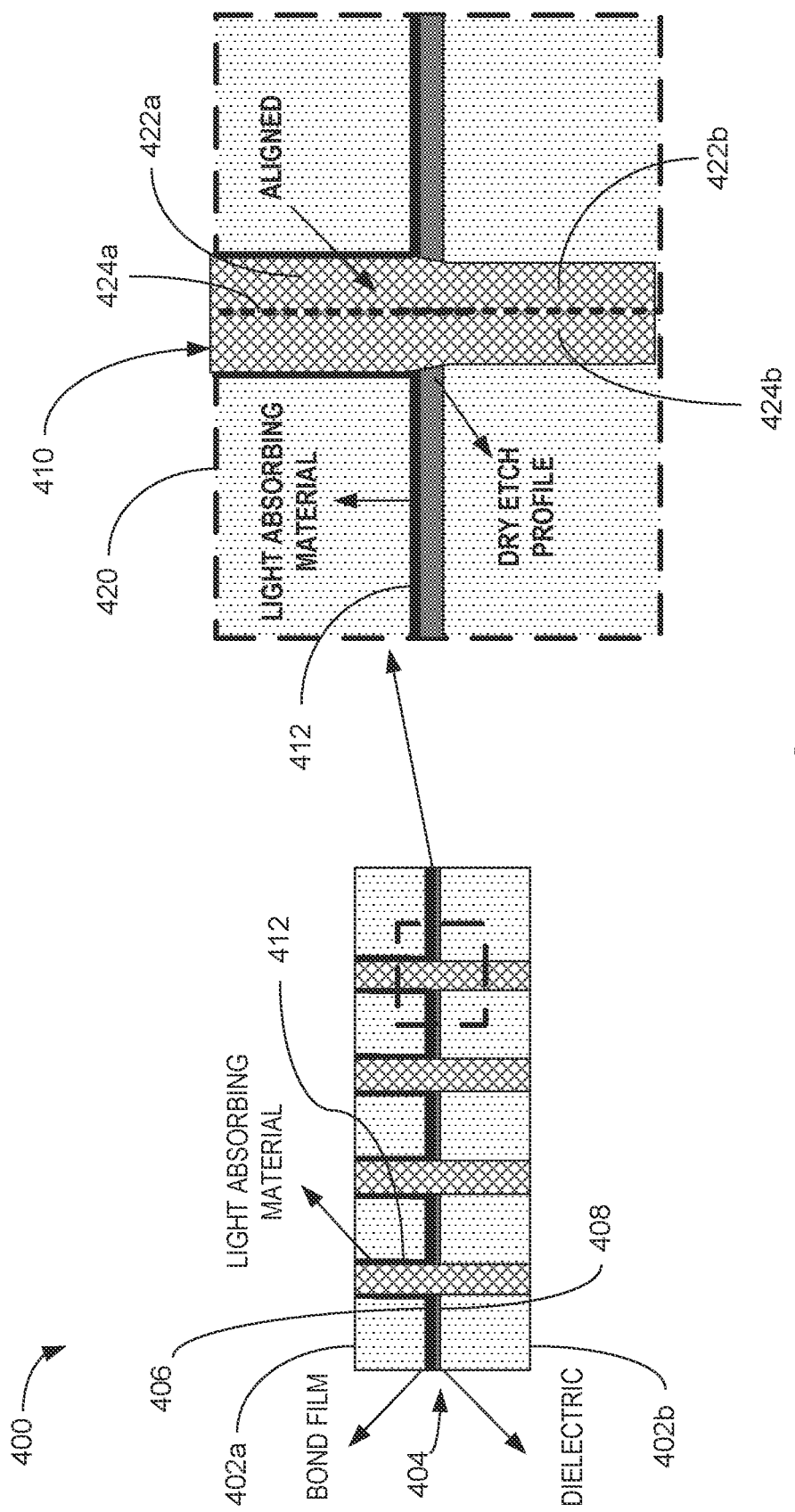
FIG. 4 is a cross-sectional view of an example semiconductor device in accordance with teachings of this disclosure.

FIG. 4 is a cross-sectional view of an example semiconductor device 400 in accordance with teachings of this disclosure. The example semiconductor device 400 is similar to the example semiconductor device 100 shown in FIG. 1 but, instead, includes interconnect portions that are aligned between a first glass portion 402a and a second glass portion 402b (as opposed to being offset). Further, an example interface layer 404, which is positioned between the first and second glass portions 402a, 402b, includes at least one of a bond film 406 or a dielectric 408. In the illustrated view of FIG. 4, interconnects 410 are implemented as TGVs. In contrast to the example semiconductor device 100 of FIG. 1, light absorption material 412 is implemented.

In the illustrated view of FIG. 4, a detail 420 shows a portion of the example semiconductor device 400. As can be seen in the detail 420, the example interconnect 410 includes a first portion 422a with a corresponding first center axis 424a and, similarly, a second portion 422b with a corresponding second center axis 424b. In this example, the first center axis 424a and the second center axis 424b are substantially aligned based on a process by which the example semiconductor device 400 is produced, as will be discussed in greater detail below in connection with FIGS. 5 and 6.

Figure 5:
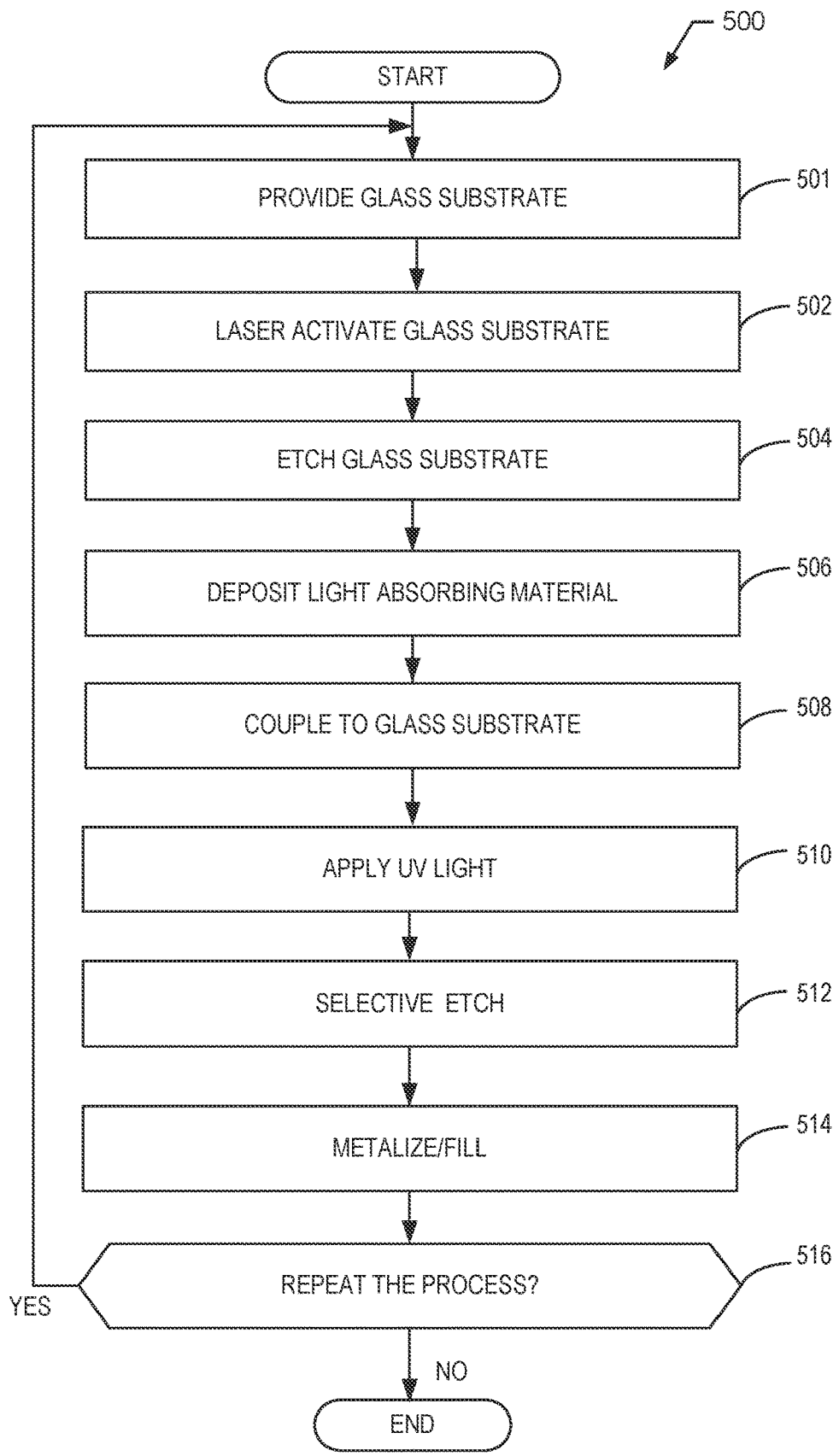
FIG. 5 is a flowchart representative of an example method to produce the example semiconductor device of FIG. 4.

FIG. 5 is a flowchart representative of an example method 500 to produce the example semiconductor device 400 of FIG. 4.

At block 501, a first glass substrate 602 (shown in FIG. 6A) is provided (e.g., as a raw glass substrate). In this example, the first glass substrate 602 generally exhibits a layer-like structure and/or shape.

At block 502, the first glass substrate 602 is laser activated, for example. However, any appropriate surface activation methodology can, instead, be implemented.

At block 504, the first glass substrate 602 is etched. The first glass substrate 602 can be photo-etched, chemical-etched or any other appropriate type of etching, machining, cutting, etc. can be performed.

At block 506, in the illustrated example, the light absorption material 412 is deposited onto the first glass substrate 602.

At block 508, the first glass substrate 602 is bonded and/or coupled to a second glass substrate 610 (shown in FIG. 6E) to define a glass core, for example.

At block 510, ultraviolet (UV) light is applied to the glass core and/or the first glass substrate 602.

At block 512, the glass core is selectively etched.

At block 514, the glass core is metallized/filled. In this example, TGVs are defined in the glass core to define the example semiconductor device 400.

At block 516, it is determined whether to repeat the process. If the process is to be repeated (block 516), control of the process returns to block 501. Otherwise, the process ends. The determination may be based on whether additional glass portions, cores and/or layers are to be added to the example semiconductor device 400.

FIGS. 6A-6H illustrate example stages in an example fabrication process to produce the example semiconductor device 400 of FIG. 4. Turning to FIG. 6A, the aforementioned glass substrate 602 is shown.

FIG. 6B depicts the example glass substrate 602 being laser activated to define activated regions 604. In some examples, the activated regions 604 facilitate subsequent etching.

Turning to FIG. 6C, the glass substrate 602 is etched (e.g., selectively etched), thereby defining apertures 606 extending through an entire depth of the glass substrate 602, for example.

FIG. 6D depicts the example light absorption material 412 being applied to the glass substrate 602.

FIG. 6E depicts the glass substrate 602 of the illustrated example being coupled to the aforementioned glass substrate 610, which is not pre-patterned in this example. The example glass substrate 602 can be bonded to the glass substrate 610 via the bond film 406, an etch stop and/or a protective layer. In some examples, the etch stop is generally transparent to UV light by utilizing materials such as polydimethylsiloxane (PDMS) or fluorinated ethylene propylene (FEP) type polymers, for example.

In the illustrated example of FIG. 6F, UV light is applied and/or directed to the glass substrate 602 and/or toward the aforementioned apertures 606. In some examples, an excimer laser (e.g., a highly directional flood type exposure) is utilized to provide the UV light to expose areas corresponding to the apertures 606. Additionally or alternatively, a UV exposure process with a photo-definable glass is implemented, such as lithium silicate based glasses and the like, for example. However, any appropriate materials and/or UV exposure process can be implemented instead so long as the glass implemented is compatible with UV exposure methods and/or an amount of applied energy necessitated by pattern definition.

Turning to FIG. 6G, an example etching process causes apertures 612 to extend through the glass substrate 610. In the illustrated example, portions of the glass substrate 610 that are etched are based on the UV exposure process shown in FIG. 6F and, thus, the apertures 612 of the glass substrate 610 are aligned with the apertures 606.

FIG. 6H depicts example metallization and/or fill processes that define the example semiconductor device 400.

Figure 7:
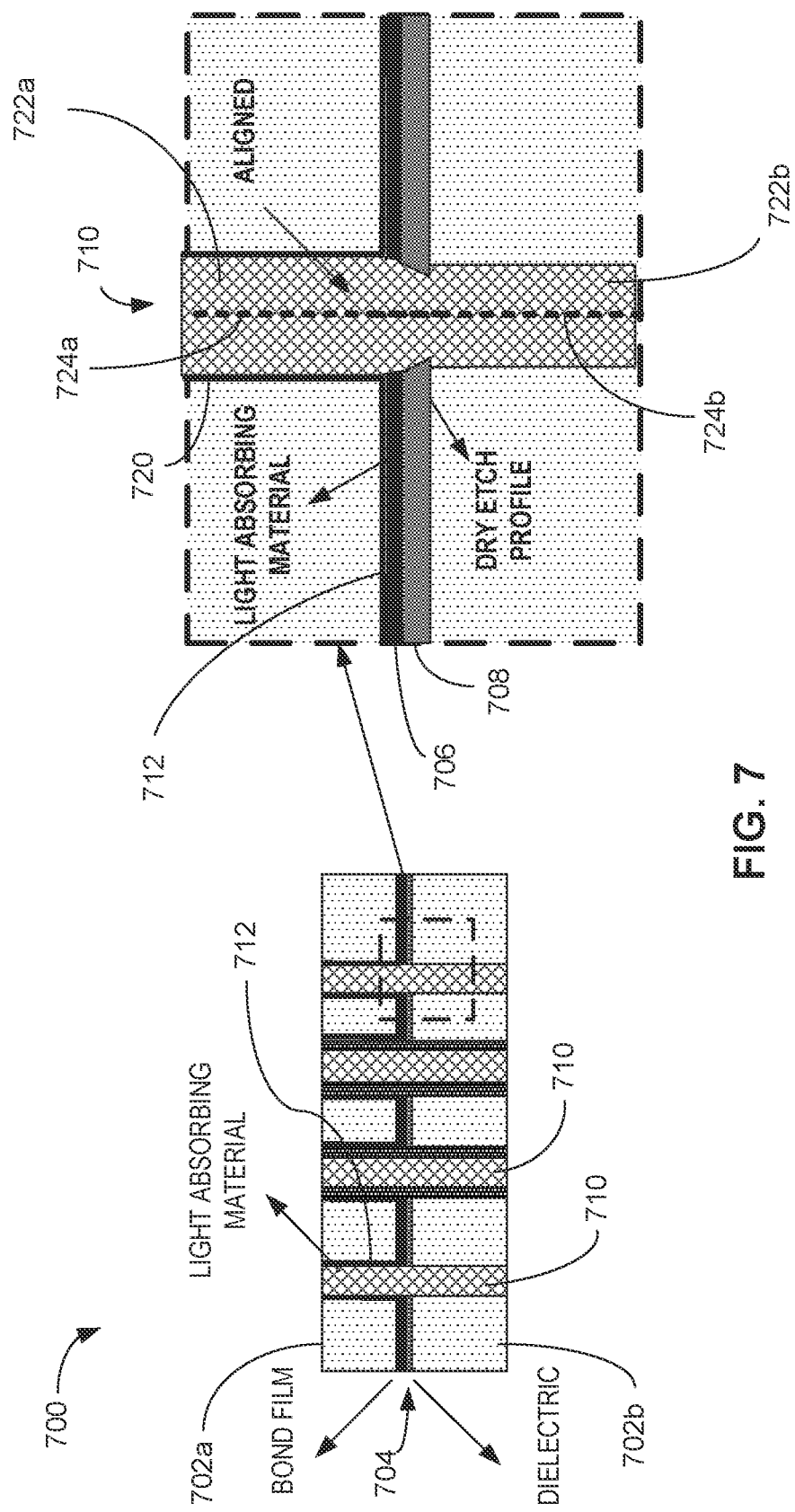
FIG. 7 is a cross-sectional view of an example semiconductor device in accordance with teachings of this disclosure.

FIG. 7 is a cross-sectional view of an example semiconductor device 700 in accordance with teachings of this disclosure. The example semiconductor device 700 is similar to the example semiconductor device 400 of FIG. 4 in that it is self-aligning between glass layers. The semiconductor device 700 of the illustrated example includes a first glass portion 702a and a second glass portion 702b with an interface layer 704 positioned therebetween. In turn, the example interface layer 704 includes at least one of a bond film 706 or a dielectric 708. In the illustrated view of FIG. 7, interconnects 710, as well as a light absorption material 712, are depicted.

In this example, a detail 720 shows a portion of the example semiconductor device 700. As can be seen in the detail 720, the interconnect 710 includes a first portion 722a with a corresponding first center axis 724a and, similarly, a second portion 722b with a corresponding second center axis 724b. In this example, the first center axis 724a and the second center axis 724b are substantially aligned, as will be discussed in greater detail below in connection with FIGS. 8 and 9.

Figure 8:
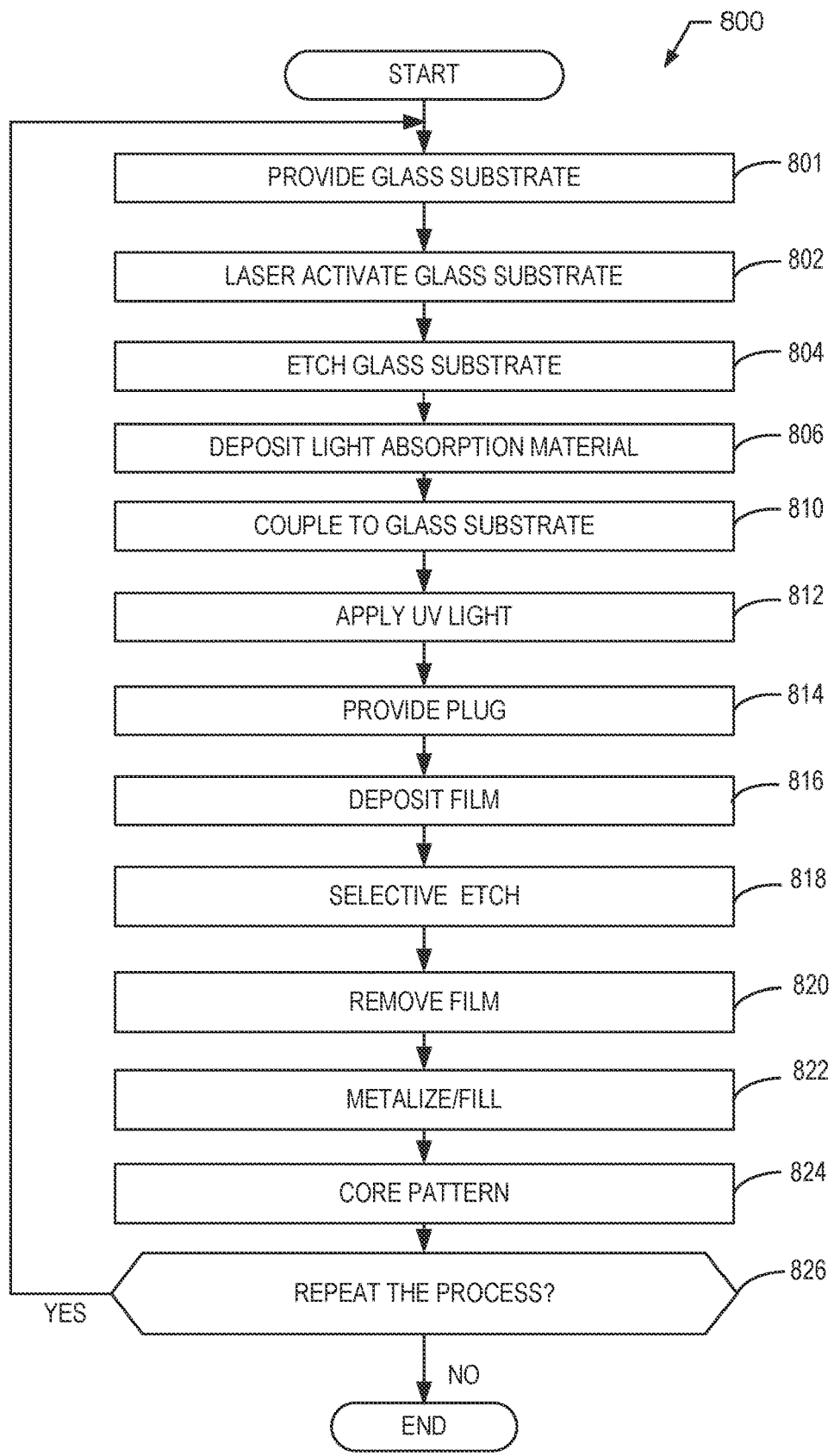
FIG. 8 is a flowchart representative of an example method to produce the example semiconductor device of FIG. 7.

FIG. 8 is a flowchart representative of an example method 800 to produce the example semiconductor device 700 of FIG. 7.

At block 801, a first glass substrate 902 (shown in FIG. 9A) is provided (e.g., as a raw glass substrate). In this example, the first glass substrate 902 is positioned for subsequent coupling to at least one other additional glass substrate.

At block 802, the first glass substrate 902 of the illustrated example is laser activated, for example. However, any other appropriate surface activation methodology can instead be implemented.

At block 804, in this example, the first glass substrate 902 is etched. The example first glass substrate 902 can be photo-etched, chemical-etched or any other appropriate type of etching process can be employed.

At block 806, in the illustrated example, the light absorption material 712 is deposited onto the first glass substrate 902.

At block 810, the example first glass substrate 902 is bonded and/or coupled to a second glass substrate 908 (shown in FIG. 9E) to define a glass core.

At block 812, UV light is applied. In this example, the UV light is directed toward the aforementioned apertures of the first glass substrate 902 and/or the glass core.

At block 814, at least one plug is added and/or provided. In this example, at least one plug with a relatively high magnetic permeability is provided to the glass core.

At block 816, in some examples, a protective film is deposited over a surface defined by the at least one plug.

At block 818, the glass core is selectively etched.

At block 820, the aforementioned protective film is removed. Additionally or alternatively, the protective film is etched and/or dissolved in a solution applied thereto.

At block 822, the glass core is metallized/filled. As a result, TGVs are defined in the glass core, for example.

At block 824, the glass core is patterned. For example, traces and/or interconnects are patterned onto surfaces of the glass core.

At block 826, it is determined whether to repeat the process. If the process is to be repeated (block 826), control of the process returns to block 801. Otherwise, the process ends. The determination may be based on whether additional glass portions, cores and/or layers are to be added to the example semiconductor device 700.

Figure 9A:
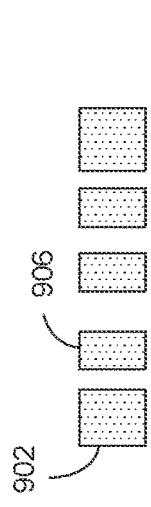
FIGS. 9A-9L illustrate stages in an example fabrication process to produce the example semiconductor device of FIG. 7.

FIGS. 9A-9L illustrate example stages in an example fabrication process to produce the example semiconductor device 700 of FIG. 7. Turning to FIG. 9A, the aforementioned example first glass portion 902, which is a raw glass substrate in this example, is provided.

Figure 9B:
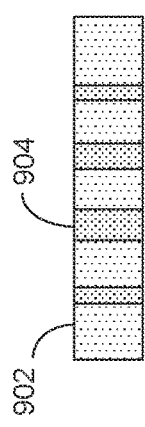

In the illustrated example of FIG. 9B, a laser activation process is performed to define activated zones 904.

Figure 9C:
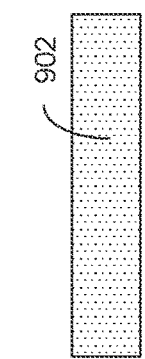

Turning to FIG. 9C, the example glass substrate 902 is etched to define apertures 906.

Figure 9D:
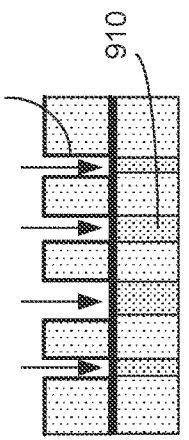

FIG. 9D depicts the example light absorption material 712 being applied to the glass substrate 902. The light absorption material 712 can be electrically non-conductive, for example.

Figure 9E:
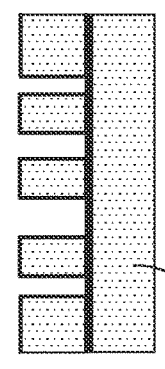

FIG. 9E depicts the glass substrate 902 of the illustrated example being coupled to the glass substrate 908, which is not pre-patterned in this example. The glass substrate 902 and the glass substrate 908 can be coupled via at least one of a bond film, a protective film, an etch stop and/or a dielectric. In some examples, a protective film or etch stop material can include materials generally transparent to UV light, such as PDMS or FEP type polymers, for example.

Figure 9F:
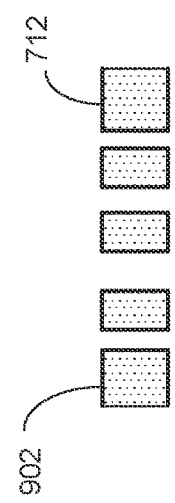

In the illustrated example of FIG. 9F, UV light is applied to the aforementioned apertures 906 to define activated regions 910. In this example, the application of the UV light through and/or toward the apertures 906 enables alignment of interconnects and/or interconnect portions between different glass layers of the example semiconductor device 700.

Figure 9G:
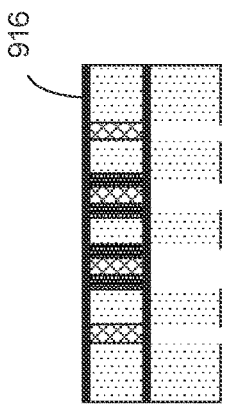

FIG. 9G depicts example plugs (e.g., magnetic plugs) 912 being placed into ones of the apertures 906.

Figure 9H:
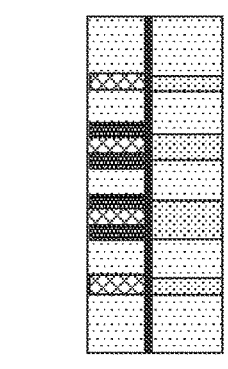

FIG. 9H depicts metallization and/or fill processes that include drilling to define a central aperture for each interconnect. In particular, a mechanical drill or a laser drill can be utilized. In examples where a laser drill is utilized, a "soft" etch may be advantageous after the example stage shown in FIG. 9J. The "soft" etch can be applied for mechanical or laser drilling processes. In some examples, a laser stop material is implemented for improved control of drill processes.

Figure 9I:
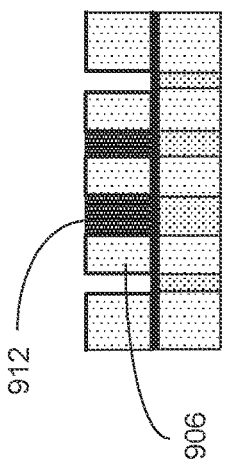

In the illustrated example of FIG. 9I, a protective film 916 is placed onto the glass core while a selective etching process is performed on a side opposite to that of the protective film 916.

Figure 9J:
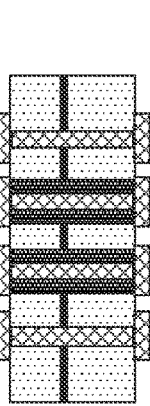

Turning to FIG. 9J, the protective film 916 of FIG. 9I is at least partially removed and etching is performed to expose surfaces 918, for example.

Figure 9K:
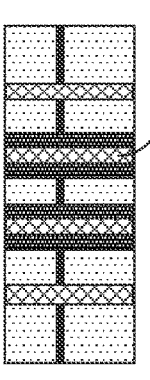

FIG. 9K depicts plugging with an insulative plug, drilling the plug, seed deposition (e.g., copper seed deposition), plating (e.g., copper plating) and grinding to define coaxial interconnects 920.

Figure 9L:
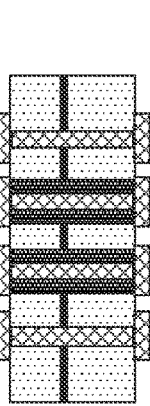

In the illustrated example of FIG. 9L, patterning of traces 922 is performed onto the glass core. Accordingly, the traces 922 can be electrically coupled to other components or interconnects.

Figure 10:
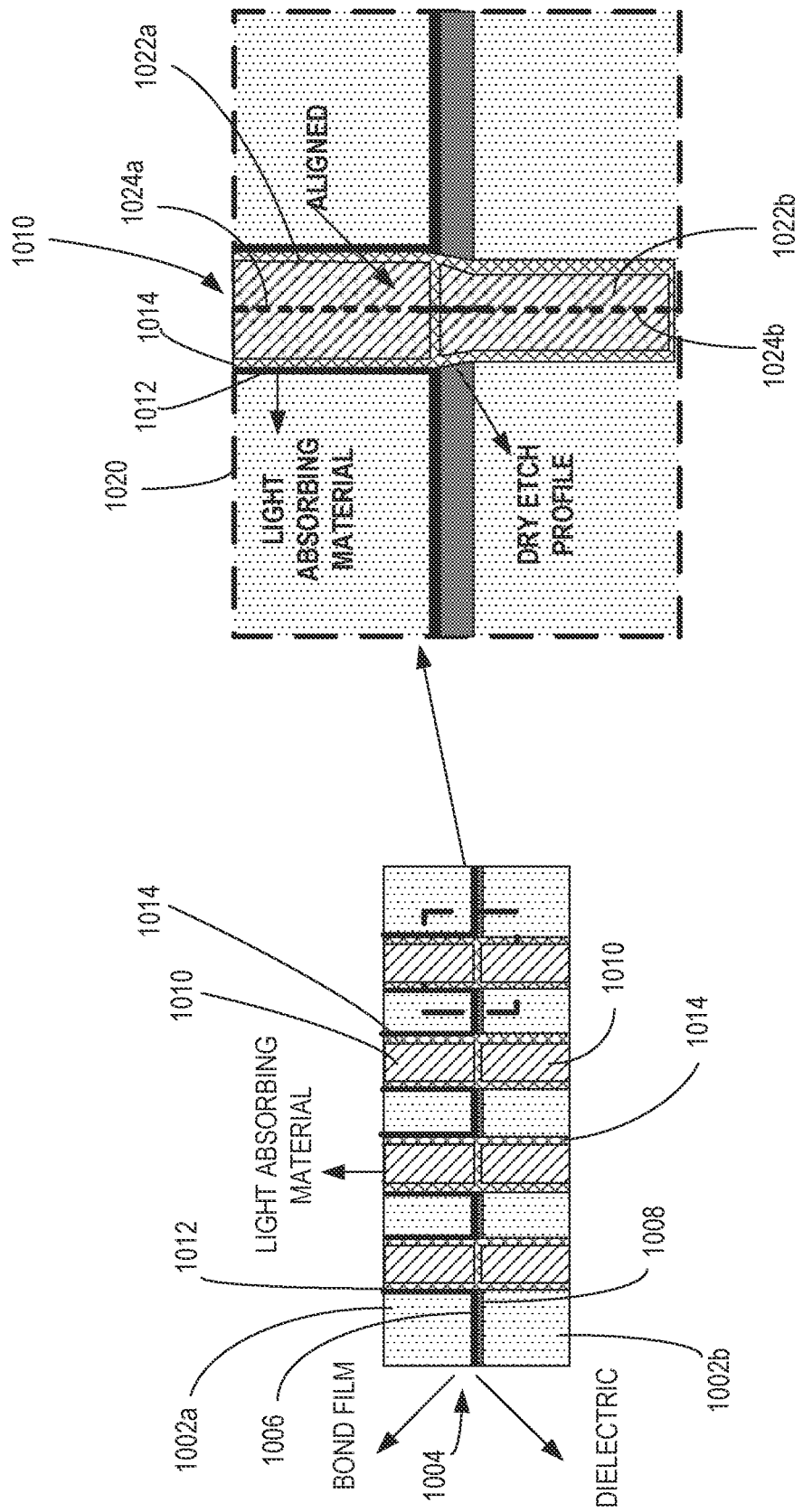
FIG. 10 is a cross-sectional view of an example semiconductor device in accordance with teachings of this disclosure.

FIG. 10 is a cross-sectional view of an example semiconductor device 1000 in accordance with teachings of this disclosure. The semiconductor device 1000 of the illustrated example includes a first glass portion 1002a and a second glass portion 1002b. Further, an example interface layer 1004, which is positioned between the first glass portion 1002a and the second glass portion 1002b, includes at least one of a bond film 1006 or a dielectric 1008. Example interconnects 1010 and a light absorption material 1012 are also shown. Further, the example semiconductor device 1000 also includes a copper layer 1014.

In the illustrated view of FIG. 10, a detail 1020 shows a portion of the example semiconductor device 1000. As can be seen in the detail 1020, the interconnect 1010 includes a first portion 1022a with a corresponding first center axis 1024a and, similarly, a second portion 1022b with a corresponding second center axis 1024b. In this example, the first center axis 1024a and the second center axis 1024b are substantially aligned.

Figure 11:
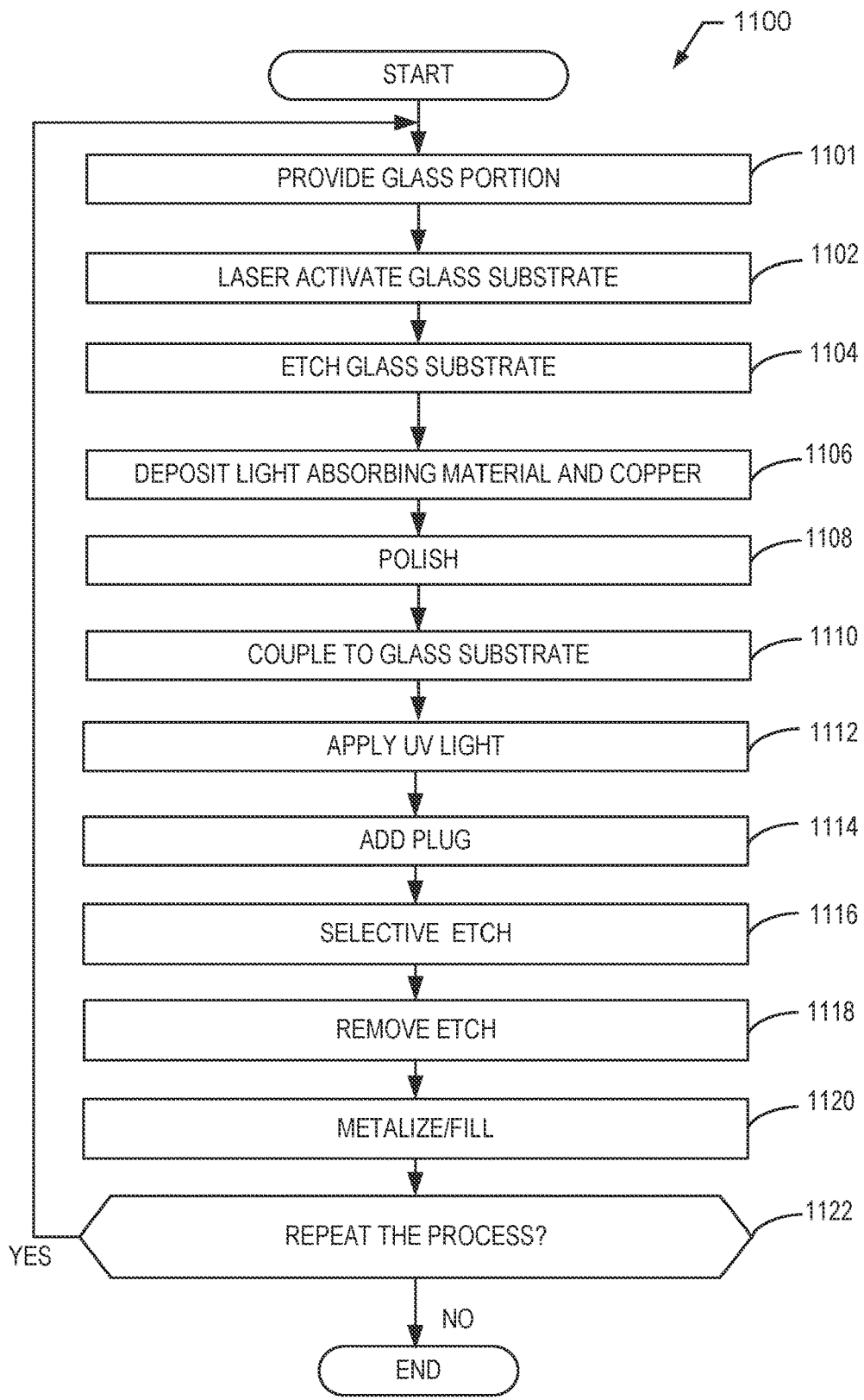
FIG. 11 is a flowchart representative of an example method to produce the example semiconductor device of FIG. 10.

FIG. 11 is a flowchart representative of an example method 1100 to produce the example semiconductor device of FIG. 10.

At block 1101, a first glass substrate 1202 (shown in FIG. 12A) is provided.

At block 1102, portions and/or regions of the example first glass substrate 1202 are laser activated for subsequent laser etching. However, any appropriate surface activation methodology can instead be implemented.

At block 1104, in this example, the first glass substrate 1202 is etched. The first glass substrate 1202 can be photo-etched, chemical-etched or any other appropriate type of etching may be utilized.

At block 1106, in the illustrated example, the light absorption material 1012 and the copper layer 1014 are deposited and/or provided onto the first glass substrate 1202 with the copper layer 1014 surrounding the light absorption material 1012.

At block 1108, a polishing process is performed on the first glass substrate 1202 (e.g., on a first side of the first glass substrate 1202 and on a second side of the first glass substrate 1202 that is opposite the first side). In this example, portions of the copper layer 1014 are polished (e.g., removed).

At block 1110, the first glass substrate 1202 is bonded and/or coupled to a second glass portion 1212 (shown in FIG. 12F) to define a glass core. In some examples, the first glass substrate 1202 is bonded to the second glass substrate 1212 with a bond film, an etch stop material and/or a protective film.

At block 1112, UV light is applied. In this example, the UV light is directed toward the first glass substrate 1202 and/or the glass core.

At block 1114, at least one plug is provided and/or added to the glass core. In some examples, a protective film is deposited over a surface defined by the at least one plug.

At block 1116, the glass core is selectively etched.

At block 1118, the aforementioned protective film and/or an etch is removed.

At block 1120, the glass core is metallized/filled. In this example, TGVs are defined in the glass core to define the example semiconductor device 1000.

At block 1122, it is determined whether to repeat the process. If the process is to be repeated (block 1122), control of the process returns to block 1101. Otherwise, the process ends. The determination may be based on whether additional glass portions, cores and/or layers are to be added to the example semiconductor device 1000.

Figures 12A, 12B, 12C, 12D, 12E, 12F, 12G, 12H, 12I, 12J, 12K:
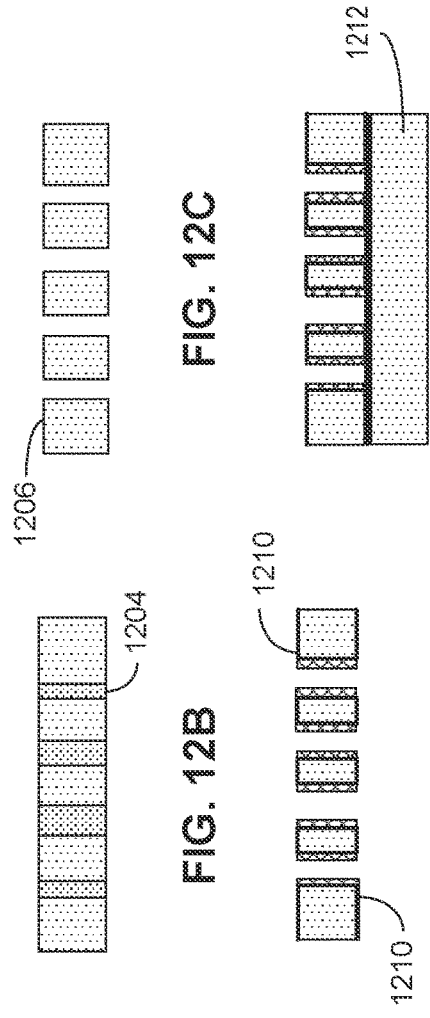
FIGS. 12A-12K illustrate stages in an example fabrication process to produce the example semiconductor device of FIG. 10.

FIGS. 12A-12K illustrate stages in an example fabrication process to produce the example semiconductor device 1000 of FIG. 10. Turning to FIG. 12A, the aforementioned first glass substrate 1202, which is a raw glass substrate in this example, is provided.

In the illustrated example of FIG. 12B, a laser activation process is performed to define activated zones 1204.

Turning to FIG. 12C, the glass substrate 1202 is etched to define apertures 1206.

FIG. 12D depicts the example light absorption material 1012 and the copper layer 1014 being applied and/or deposited to the glass substrate 1202. In this example, the copper layer 1014 is deposited to surround the light absorption material 1012. Further, the copper layer 1014 extends along a length of corresponding TGVs in this example.

FIG. 12E depicts a surface 1208 and a surface 1210 being polished (e.g., copper polished). In some examples, copper from the copper deposition is at least partially removed (e.g., fully removed) from the surface 1208 and the surface 1210.

FIG. 12F depicts the glass substrate 1202 of the illustrated example being coupled to the aforementioned glass substrate 1212, which is not patterned in this example. The glass substrate 1202 and the glass substrate 1212 can be coupled together via at least one of a bond film, a protective film, an etch stop and/or a dielectric. In some examples, protective film or etch stop material that is generally transparent to UV light can be implemented, such as materials including PDMS or FEP type polymers, for example.

In the illustrated example of FIG. 12G, UV light is applied to the aforementioned apertures 1206 (e.g., from a UV light source, a laser, etc.) to define activated regions 1214 that are utilized in subsequent etching to align apertures between the glass substrate 1202 and the glass substrate 1212.

Turning to FIG. 12H, example plugs (e.g., magnetic plugs) 1216 are depicted being placed into ones of the apertures 1206. Additionally or alternatively, a protective film 1220 is applied.

FIG. 12I depicts a selective etch process defining apertures 1224.

FIG. 12J depicts removal of the example protective film 1220 shown in FIGS. 12H and 12I. As a result, an exposed surface 1226 is formed.

FIG. 12K depicts metallization and/or fill processes that include drilling to define the example semiconductor device 1000. In particular, a mechanical drill or a laser drill can be utilized.

Any of the aspects, features, components and/or process methodology described above in connection with the examples of FIGS. 1-12K can be combined with any other aspects, features, components and/or process methodology of other examples.

Further examples and combinations thereof include the following: Example 1 includes an apparatus comprising a first glass substrate, a second glass substrate, an interface layer between the first glass substrate and the second glass substrate, the interface layer coupling the first glass substrate to the second glass substrate, and an interconnect extending through at least a portion of the first glass substrate and at least a portion of the second glass substrate.

Example 2 includes the apparatus as defined in example 1, wherein the interface layer includes a dielectric layer.

Example 3 includes the apparatus as defined in example 1, wherein the interface layer includes a bonding film.

Example 4 includes the apparatus as defined in example 1, wherein the interconnect includes a first portion extending through the first glass substrate and a second portion extending through the second glass substrate, and wherein the first portion of the interconnect and the second portion of the interconnect are substantially aligned.

Example 5 includes the apparatus as defined in example 1, wherein the interconnect includes a through-glass via (TGV).

Example 6 includes the apparatus as defined in example 5, further including a plug surrounding the TGV.

Example 7 includes the apparatus as defined in example 6, further including light absorption material surrounding at least a portion of the plug.

Example 8 includes the apparatus as defined in example 5, further including light absorption material surrounding at least a portion of the TGV.

Example 9 includes the apparatus as defined in example 1, further including light absorption material surrounding at least a portion of at least one of the first glass substrate or the second glass substrate.

Example 10 includes a glass core for use with a semiconductor device, the glass core comprising a first glass substrate layer, a second glass substrate layer, and an interface layer between the first glass substrate layer and the second glass substrate layer, the interface layer including at least one of a dielectric layer or a bonding film, the interface layer coupling the first glass substrate layer and the second glass substrate layer together.

Example 11 includes the glass core as defined in example 10, further including a through-glass via (TGV) extending through at least a portion of the glass core.

Example 12 includes the glass core as defined in example 11, wherein the TGV includes a first portion extending through the first glass substrate layer, and a second portion extending through the second glass substrate layer, wherein the first portion of the TGV and the second portion of the TGV are substantially aligned.

Example 13 includes the glass core as defined in example 11, wherein TGV is at least partially surrounded by light absorption material.

Example 14 includes the glass core as defined in example 13, wherein the light absorption material extends through the first glass substrate layer or the second glass substrate layer.

Example 15 includes the glass core as defined in example 13, further including a copper layer, the light absorption material between the copper layer and at least one of the first glass substrate layer or the second glass substrate layer.

Example 16 includes the glass core as defined in example 10, wherein the first glass substrate layer or the second glass substrate layer includes a protrusion to be received by a groove of another of the first glass substrate layer or the second glass substrate layer.

Example 17 includes a method comprising coupling a first glass substrate to a second glass substrate with an interface layer positioned therebetween, the interface layer including at least one of a bonding film or a dielectric layer, and defining an interconnect that extends through at least a portion of the first glass substrate and at least a portion of the second glass substrate.

Example 18 includes the method as defined in example 17, further including providing a plug to at least one of the first glass substrate or the second glass substrate, drilling the plug to define a central aperture thereof, and metalizing the central aperture to define the interconnect.

Example 19 includes the method as defined in example 17, wherein at least one of the first glass substrate or the second glass substrate is patterned with a pattern prior to being coupled to another of the first glass substrate or the second glass substrate.

Example 20 includes the method as defined in example 19, further including activating at least one of the first glass substrate or the second glass substrate to define an activated region thereof by directing UV light toward the pattern.

Example 21 includes the method as defined in example 20, further including etching the activated region to define an aperture that corresponds to the interconnect.

Example 22 includes the method as defined in example 17, wherein the coupling of the first glass substrate to the second glass substrate includes compressing the interface layer between the first glass substrate and the second glass substrate.

Example 23 includes the method as defined in example 17, wherein the coupling of the first glass substrate to the second glass substrate includes aligning a protrusion of the first glass substrate or the second glass substrate to a groove of another of the first glass substrate or the second glass substrate.

From the foregoing, it will be appreciated that example systems, methods, apparatus, and articles of manufacture have been disclosed that enable semiconductor devices with glass structures and/or cores that are highly resistant to damage. Further, examples disclosed herein enable glass structures to be relatively thick compared to known implementations. In other words, examples disclosed herein enable stacking of glass portions (e.g., glass layers, glass cores, glass core layers, etc.).

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   a first glass substrate;
   a second glass substrate;
   an interface layer between the first glass substrate and the second glass substrate, the interface layer coupling the first glass substrate to the second glass substrate; and
   an interconnect extending through at least a portion of the first glass substrate and at least a portion of the second glass substrate, wherein the interconnect includes a first portion extending through the first glass substrate and a second portion extending through the second glass substrate, and wherein the first portion of the interconnect and the second portion of the interconnect are offset along a lateral direction.

2. The apparatus as defined in claim 1, wherein the interface layer includes a dielectric layer.

3. The apparatus as defined in claim 1, wherein the interface layer includes a bonding film.

4. The apparatus as defined in claim 1, wherein the interconnect includes a through-glass via (TGV).

5. The apparatus as defined in claim 4, further including a plug surrounding the TGV.

6. The apparatus as defined in claim 5, further including light absorption material surrounding at least a portion of the plug.

7. The apparatus as defined in claim 4, further including light absorption material surrounding at least a portion of the TGV.

8. The apparatus as defined in claim 1, further including light absorption material surrounding at least a portion of at least one of the first glass substrate or the second glass substrate.

9. A glass core for use with a semiconductor device, the glass core comprising:
   a first glass substrate layer;
   a second glass substrate layer;

an interface layer between the first glass substrate layer and the second glass substrate layer, the interface layer including at least one of a dielectric layer or a bonding film, the interface layer coupling the first glass substrate layer and the second glass substrate layer together; and an interconnect extending through at least a portion of the first glass substrate layer and at least a portion of the second glass substrate layer, wherein the interconnect includes a first portion extending through the first glass substrate layer and a second portion extending through the second glass substrate layer, and wherein the first portion of the interconnect and the second portion of the interconnect are offset along a lateral direction.

10. The glass core as defined in claim 9, wherein the interconnect includes a through-glass via (TGV) extending through at least a portion of the glass core.

11. The glass core as defined in claim 10, wherein TGV is at least partially surrounded by light absorption material.

12. The glass core as defined in claim 11, wherein the light absorption material extends through the first glass substrate layer or the second glass substrate layer.

13. The glass core as defined in claim 11, further including a copper layer, the light absorption material between the copper layer and at least one of the first glass substrate layer or the second glass substrate layer.

14. The glass core as defined in claim 9, wherein the first glass substrate layer or the second glass substrate layer includes a protrusion to be received by a groove of another of the first glass substrate layer or the second glass substrate layer.

15. A method comprising:
coupling a first glass substrate to a second glass substrate with an interface layer positioned therebetween, the interface layer including at least one of a bonding film or a dielectric layer; and defining an interconnect that extends through at least a portion of the first glass substrate and at least a portion of the second glass substrate, wherein the interconnect includes a first portion extending through the first glass substrate and a second portion extending through the second glass substrate, and wherein the first portion of the interconnect and the second portion of the interconnect are offset along a lateral direction.

16. The method as defined in claim 15, further including:
providing a plug to at least one of the first glass substrate or the second glass substrate;

drilling the plug to define a central aperture thereof; and metalizing the central aperture to define the interconnect.

17. The method as defined in claim 15, wherein at least one of the first glass substrate or the second glass substrate is patterned with a pattern prior to being coupled to another of the first glass substrate or the second glass substrate.

18. The method as defined in claim 17, further including activating at least one of the first glass substrate or the second glass substrate to define an activated region thereof by directing UV light toward the pattern.

19. The method as defined in claim 18, further including etching the activated region to define an aperture that corresponds to the interconnect.

20. The method as defined in claim 15, wherein the coupling of the first glass substrate to the second glass substrate includes compressing the interface layer between the first glass substrate and the second glass substrate.

21. The method as defined in claim 15, wherein the coupling of the first glass substrate to the second glass substrate includes aligning a protrusion of the first glass substrate or the second glass substrate to a groove of another of the first glass substrate or the second glass substrate.

22. The apparatus as defined in claim 1, wherein the first portion of the interconnect and the second portion of the interconnect partially intersect along the lateral direction.

23. The apparatus as defined in claim 22, wherein a region of the interface layer between the first portion of the interconnect and the second portion of the interconnect includes an angled edge.

* * * * *